(12) United States Patent
Shur

(10) Patent No.: US 12,464,834 B2
(45) Date of Patent: Nov. 4, 2025

(54) TERAHERTZ AND SUB-TERAHERTZ DEVICES

(71) Applicant: RENSSELAER POLYTECHNIC INSTITUTE, Troy, NY (US)

(72) Inventor: Michael Shur, Vienna, VA (US)

(73) Assignee: Rensselaer Polytechnic Institute, Troy, NY (US)

( * ) Notice: Subject to any disclaimer, the term of this patent is extended or adjusted under 35 U.S.C. 154(b) by 732 days.

(21) Appl. No.: 17/607,479

(22) PCT Filed: Apr. 28, 2020

(86) PCT No.: PCT/US2020/030248
§ 371 (c)(1),
(2) Date: Oct. 29, 2021

(87) PCT Pub. No.: WO2021/002919
PCT Pub. Date: Jan. 7, 2021

(65) Prior Publication Data
US 2022/0231182 A1   Jul. 21, 2022

Related U.S. Application Data

(60) Provisional application No. 62/839,830, filed on Apr. 29, 2019.

(51) Int. Cl.
*H10F 30/282* (2025.01)
*H10F 77/122* (2025.01)
(Continued)

(52) U.S. Cl.
CPC ......... *H10F 30/282* (2025.01); *H10F 77/122* (2025.01); *H10F 77/1246* (2025.01); *H10F 77/1248* (2025.01); *H10F 77/413* (2025.01)

(58) Field of Classification Search
CPC .......... H01L 31/1136; H01L 31/02327; H01L 31/028; H01L 31/03044; H01L 31/03046;
(Continued)

(56) References Cited

U.S. PATENT DOCUMENTS 5,986,291 A * 11/1999 Currie .................. H10D 30/475
257/E29.252
6,015,991 A   1/2000 Wheeler et al.
(Continued)

FOREIGN PATENT DOCUMENTS

WO   2013055429 A2   4/2013
WO   2017119978 A2   7/2017

OTHER PUBLICATIONS

M.S Shur et al., "Novel heterodimensional diodes and transistors" Solid-State Electronics, vol. 38, Issue 9, Sep. 1995, pp. 1727-1730, https://doi.org/10.1016/0038-1101(95)00038-U (Year: 1995).*
(Continued)

*Primary Examiner* — Sitaramarao S Yechuri
(74) *Attorney, Agent, or Firm* — Barclay Damon LLP; Anthony P. Gangemi

(57) ABSTRACT

One embodiment provides a semiconducting device for at least one of detecting, producing or manipulating electromagnetic radiation having a frequency of at least 100 gigahertz (GHz). The semiconducting device includes a heterodimensional plasmonic structure, and an active layer. The heterodimensional plasmonic structure includes at least one nanostructure configured to form a heterodimensional junction with the active layer and having a tunable resonant plasmon frequency.

16 Claims, 10 Drawing Sheets

(51) Int. Cl.
*H10F 77/124* (2025.01)
*H10F 77/40* (2025.01)

(58) Field of Classification Search
CPC ........... H01L 31/035281; H01L 31/112; H01L 31/08; H10F 30/282; H10F 30/28; H10F 30/00; H10F 77/122; H10F 77/1246; H10F 77/1248; H10F 77/413; H10F 77/147

See application file for complete search history.

(56) References Cited

U.S. PATENT DOCUMENTS

| | | | |
|---|---|---|---|
| 7,170,085 B2 | 1/2007 | Raspopin et al. | |
| 8,120,014 B2 | 2/2012 | Nabet et al. | |
| 8,148,688 B2 * | 4/2012 | Kawano | H10F 30/28 |
| | | | 257/187 |
| 8,215,489 B1 | 7/2012 | Roberts et al. | |
| 8,433,170 B2 | 4/2013 | Cooke | |
| 8,994,005 B2 | 3/2015 | Mitin et al. | |
| 9,105,791 B1 * | 8/2015 | Dyer | H10F 30/287 |
| 9,368,667 B1 * | 6/2016 | Kim | G01N 27/4146 |
| 9,513,171 B2 | 12/2016 | Cumming et al. | |
| 9,759,689 B2 | 9/2017 | Guo | |
| 10,084,102 B2 | 9/2018 | Cai et al. | |
| 10,084,107 B2 | 9/2018 | Fu et al. | |
| 2006/0289761 A1 | 12/2006 | Nabet et al. | |
| 2009/0140801 A1 | 6/2009 | Ozyilmaz et al. | |
| 2010/0059792 A1 | 3/2010 | Shur et al. | |
| 2011/0170208 A1 * | 7/2011 | Zhao | C01B 32/182 |
| | | | 252/582 |
| 2012/0148252 A1 | 6/2012 | Turchinovich | |
| 2014/0225067 A1 * | 8/2014 | Kim | H10F 30/10 |
| | | | 257/29 |
| 2016/0218237 A1 | 7/2016 | Perera et al. | |
| 2016/0380121 A1 * | 12/2016 | Suzuki | H10F 77/122 |
| | | | 257/29 |
| 2017/0005207 A1 * | 1/2017 | Li | H10F 77/1433 |
| 2018/0122912 A1 * | 5/2018 | Kim | H10D 64/518 |
| 2018/0315880 A1 | 11/2018 | Jadidi et al. | |

OTHER PUBLICATIONS

International Search Report and The Written Opinion of the International Searching Authority, International Application No. PCT/US2020/030248, mailed Dec. 18, 2020.

* cited by examiner

TERAHERTZ AND SUB-TERAHERTZ DEVICES

CROSS REFERENCE TO RELATED APPLICATION(S)

This application claims the benefit of U.S. Provisional Application No. 62/839,830, filed Apr. 29, 2019, which is incorporated by reference as if disclosed herein in its entirety.

FIELD

The present disclosure relates to devices, in particular to, terahertz and sub-terahertz devices.

BACKGROUND

Terahertz (THz) technology has found numerous applications ranging from nondestructive remote sensing to the detection of chemical agents, radio astronomy, nondestructive VLSI (very large scale integration) testing, concealed weapons and object detection, gasoline and oil quality testing, biotechnology, medical diagnostics, cancer detection, explosive detection, THz spectroscopy of explosives and drugs, THz communications, and imaging. THz imaging and sensing are based on the interaction of the THz radiation with phonons, hydrogen bonds, and bond and molecular vibrations. THz absorption, reflection, and polarization are also affected by chemical changes, changes in polarizability or protein density or conformation and are relatively highly sensitive to water content.

Plasma waves propagating in the channel of a field effect transistor (FET) with a continuous flow of electrons from the source to the drain have been used to detect, mix, and frequency multiply THz and sub-THz radiation including using homodyne or heterodyne detection. While the feature sizes of these devices may be scaled to obtain the device parameters close to the THz gap (i.e., frequencies from a few hundred gigahertz to 30 THz), contact parasitic impedances, electron ballistic scattering by contacts, and viscosity of the electronic fluid limit the performance of such devices.

SUMMARY

In some embodiments, there is provided a semiconducting device for at least one of detecting, producing or manipulating electromagnetic radiation having a frequency of at least 100 gigahertz (GHz). The semiconducting device includes a heterodimensional plasmonic structure, and an active layer. The heterodimensional plasmonic structure includes at least one nanostructure configured to form a heterodimensional junction with the active layer and having a tunable resonant plasmon frequency.

In some embodiments of the semiconducting device, the nanostructure is selected from the group comprising a nanodot, a nanoparticle, a nanocolumn, a nanocone, a nanowire, a nanotube, or a combination thereof. In some embodiments of the semiconducting device, the active layer is selected from the group comprising a two-dimensional electron gas, a three-dimensional electron gas, a two-dimensional hole gas and a three-dimensional hole gas.

In some embodiments of the semiconducting device, at least one of the active layer and the heterodimensional plasmonic structure is fabricated with a material selected from the group comprising silicon (Si), gallium-nitride (GaN), indium gallium arsenide (InGaAs), and graphene.

In some embodiments, the semiconducting device includes a gate coupled to the active layer. The gate is configured receive a bias voltage. The bias voltage is configured to tune the resonant plasmon frequency. In some embodiments, the semiconducting device includes a drain contact and a source contact contacting the active layer. A configuration of the drain contact and the source contact is selected from the group including continuous side contacts, split side contacts, side contacts in an opposing configuration and side contacts in a cross configuration.

In some embodiments of the semiconducting device, at least one of the heterodimensional plasmonic structure and the gate include an asymmetric feature configured to provide an asymmetry between the gate and the drain.

In some embodiments of the semiconducting device, the heterodimensional plasmonic structure includes a plurality of nanostructures. A first portion of the plurality of nanostructures is fabricated with a first set of parameters and a second portion of the plurality of nanostructures is fabricated with a second set of parameters. A selected first parameter of the first set differs from a selected second parameter of the second set by at least one percent (%).

In some embodiments of the semiconducting device, the active layer is periodically modulated. In some embodiments of the semiconducting device, the heterodimensional plasmonic structure includes a plurality of nanostructures. The plurality of nanostructures are periodically modulated.

In some embodiments, there is provided a field effect device for at least one of detecting, producing or manipulating electromagnetic radiation having a frequency of at least 100 gigahertz (GHz). The field effect device includes a heterodimensional plasmonic structure, an active layer, and a gate, a drain, and a source coupled to the active layer. The heterodimensional plasmonic structure includes at least one nanostructure configured to form a heterodimensional junction with the active layer and having a tunable resonant plasmon frequency.

In some embodiments of the field effect device, the nanostructure is selected from the group including a nanodot, a nanoparticle, a nanocolumn, a nanocone, a nanowire, a nanotube, or a combination thereof.

In some embodiments of the field effect device, the active layer is selected from the group including a two-dimensional electron gas, a three-dimensional electron gas, a two-dimensional hole gas and a three-dimensional hole gas.

In some embodiments of the field effect device, at least one of the active layer and the heterodimensional plasmonic structure is fabricated with a material selected from the group including silicon (Si), gallium-nitride (GaN), indium gallium arsenide (InGaAs), and graphene.

In some embodiments of the field effect device, the gate is configured receive a bias voltage. The bias voltage is configured to tune the resonant plasmon frequency.

In some embodiments, the field effect device includes a drain contact and a source contact contacting the active layer. A configuration of the drain contact and the source contact is selected from the group including continuous side contacts, split side contacts, side contacts in an opposing configuration and side contacts in a cross configuration.

In some embodiments of the field effect device, each nanostructure is capacitively coupled to the gate. In some embodiments of the field effect device, at least one of the heterodimensional plasmonic structure and the gate include an asymmetric feature configured to provide an asymmetry between the gate and the drain.

In some embodiments of the field effect device, the heterodimensional plasmonic structure includes a plurality of nanostructures. A first portion of the plurality of nanostructures is fabricated with a first set of parameters and a second portion of the plurality of nanostructures is fabricated with a second set of parameters. A selected first parameter of the first set differs from a selected second parameter of the second set by at least one percent (%).

In some embodiments of the field effect device, the active layer is periodically modulated.

BRIEF DESCRIPTION OF DRAWINGS

The drawings show embodiments of the disclosed subject matter for the purpose of illustrating features and advantages of the disclosed subject matter. However, it should be understood that the present application is not limited to the precise arrangements and instrumentalities shown in the drawings, wherein.

Figure 1:
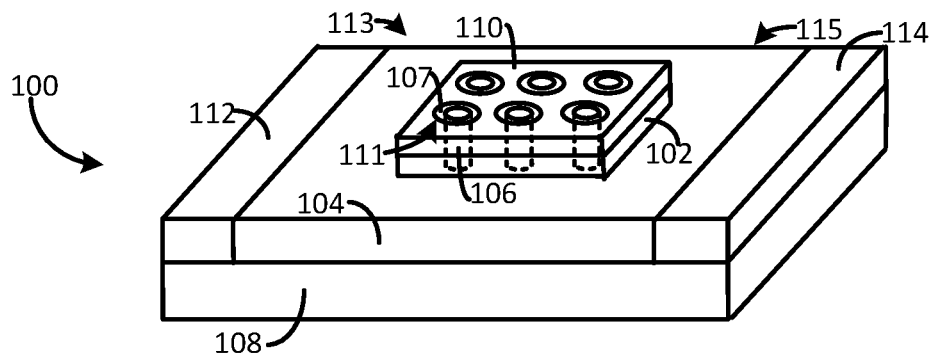
FIG. 1 illustrates an isometric view of a semiconducting device consistent with several embodiments of the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure relates to semiconducting devices configured to operate at THz and sub-THz frequencies. A semiconducting device consistent with the present disclosure may be configured to at least one of detect, produce, or manipulate electromagnetic radiation. The semiconducting device includes a heterodimensional plasmonic structure and an active layer. The heterodimensional plasmonic structure includes at least one nanostructure configured to form a heterodimensional junction with the active layer and to have a tunable resonant plasmon frequency. The resonant coupling may be achieved at or near room temperature and at sub-THz and THz frequencies. As used herein, a nanostructure is a structure with at least one dimension having a maximum size on the order of tens of nanometers (nm). Nanostructures may include, but are not limited to, nanodots, nanoparticles, nanowires, nanocones, nanotubes, nanocolumns and/or a combination thereof. The active layer may be two-dimensional (2D) or three-dimensional (3D). For example, the active layer may include, but is not limited to, a 2D electron gas (2 DEG), a 2D hole gas (2 DHG), a 3D electron gas (3 DEG) and/or a 3D hole gas (3 DHG).

It may be appreciated that the feature sizes of modern field effect transistors (FETs) have reached dimensions as low as 7 nanometers (nm). Such FETs may then be suitable as nanoscale detectors for sub-wavelength sub-THz and THz imaging. Plasmonic resonant properties of nanostructures forming heterodimensional junctions with a 2D gas (electron or hole) enable local resonant coupling and may be used for sub-wavelength imaging. In one nonlimiting example, the resonant plasmon frequency of a nanostructure may be tuned by varying a bias of a gate capacitively coupled to the nanostructures.

The plasmonic properties of nanostructures accounting for the boundary scattering and for the carrier fluid velocity indicate that the plasma oscillations in silicon (Si), gallium nitride (GaN), and indium gallium arsenide (InGaAs) and nanostructures may achieve high quality factors. For example, a single embedded nanostructure or an array of embedded nanostructures placed into a perforated asymmetrical 2 DEG or/and 2 DHG structures or superlattices may be used for detection, mixing, or frequency multiplication of sub-THz, THz or infrared (IR) radiation. In another example, embedded nanostructure arrays, as described herein, may be used as active elements of THz emitters and as sub-THz, THz, or IR sensitive photodetector layers for pixelless THz to visible converters.

In another example, combining impinging beams of the different frequencies may facilitate frequency mixing due to nonlinearity of a semiconducting device that includes a heterodimensional plasmonic structure and active layer, as described herein. At high intensity of an impinging THz electromagnetic radiation beam, frequency multiplication is achieved in some embodiments. Possible applications include THz and sub-THz components of THz imaging and sensing systems for THz and sub THz communication, beyond 5G Wi-Fi technology, biotechnology and medical THz, IR, and sub-THz systems.

The basic mechanism of the plasmonic detection is rectification of plasma waves excited by impinging radiation. These waves decay due to the electron (or hole for p-channel devices) scattering by impurities and lattice vibrations and due to the viscosity of the electrons (or holes) forming the electron or hole fluid if the electron-electron (or hole-hole) collisions are often enough.

If the decay time $\tau$ is long, the plasma waves may be resonant with the resonance plasma frequency $\omega_p$ determined by the device (e.g., transistor) size (for $\omega_p\tau \gg 1$). The opposite case of decayed (overdamped) plasma waves when $\omega_p\tau < 1$ is relatively more common. For short device sizes, parasitic and contact impedances start playing a dominant role.

When the electron-electron or hole-hole collisions are frequent enough, so that $\tau_{ee} \ll \tau_p$, where $$\tau_{ee} = \frac{8\pi^4 q^4 N}{\hbar \varepsilon_o^2 \varepsilon^2 k_B T} \text{ for } E_F < k_B T \quad (1)$$

$$\tau_{ee} = \frac{\pi}{4} \frac{E_F}{\hbar} \left(\frac{E_F}{k_B T}\right)^2 \ln\left(\frac{E_F}{k_B T}\right) \text{ for } E_F > k_B T \quad (2)$$

is the electron collision time for the non-degenerate gas and for the degenerate gas, respectively, $\tau_p$ is the momentum relaxation time, q is the electronic charge, $N \sim n_s/d_{ee}$ is the electron (or hole) concentration, $n_s$ is the sheet carrier density, $d_{ee}$ is the effective thickness of the 2 DEG or 2 DHG, h is the Plank constant, $\varepsilon_o$ is the dielectric permittivity of vacuum, $\varepsilon$ is the relative dielectric relative constant, $k_B$ is the Boltzmann constant, $E_F = n_s/D_2$ is the Fermi level, $$D_2 = \frac{m}{\pi \hbar^2}$$

is the two-dimensional density of states.

For a nanostructure that corresponds to a nanoparticle, the plasma frequency for an ungated nanoparticle is given by $$\omega_p = \sqrt{2\alpha k} \quad (3)$$

Here $\alpha = n_s q^2/(4\varepsilon\varepsilon_o m)$, $k = \pi/(2R)$ is the wave vector, and R is the radius of the nanoparticle.

The quality factor is defined as $Q = \omega_p/\gamma$. Here $\gamma = 1/\tau + v_F/(2R)$, $v_F = \sqrt{2qE_F/m}$ are the effective scattering rate and the Fermi velocity, respectively.

For example, for GaN, InGaAs, and Si nanodots, resonant coupling may be achieved at room temperature at relatively high frequencies (all calculations are done for T=300 K). The GaN nanoparticles have a slightly larger quality factor, thus relatively higher sheet carrier densities may be achieved in GaN (e.g., $n_s = 4.16 \times 10^{12}$ cm$^{-2}$ has been demonstrated). For InGaAs, the largest quality factor was achieved for 200 nm nanoparticles at approximately 7.6 THz. For Si and GaN, the largest quality factor was achieved for 40 nm nanoparticles at approximately 8.6 THz. Thus, these structures facilitate scanning THz images at relatively higher frequencies in some embodiments than have been achieved for typical plasmonic detectors. It is contemplated that these frequencies may reach the values suitable for applications in thermal imaging devices.

Varying the gate bias may change the surface depletion region for the nanoparticles enabling resonance tuning in some embodiments. Estimating the coupling capacitance between the nanoparticle and the 2 DEG as $C_c \sim 2\lambda R\varepsilon\varepsilon_o$, the modulation change is $Q_m \sim 2\pi R\varepsilon\varepsilon_o \Delta V_g$, where $\Delta V_g$ is the variation of the gate bias. For a nanodot disk, this leads to the relative change in the nanodisk radius $\Delta R/R \sim \varepsilon\varepsilon_o \Delta V_g/(qn_s R)$. For example, for $\Delta V_g = 0.1$ V and $\varepsilon = 11.7$, a frequency modulation $\Delta f / \sim \Delta R/(2R)$ of $\sim 10\%$ or more may be achieved.

Heterodimensional plasmonic structures with a single embedded nanoparticle may be configured to achieve imaging resolution at the nanoscale either by scanning or making multi pixel arrays. In some embodiments, such arrays may be used as the THz or infrared detector layers for pixelless image converters.

Analyses of the plasmonic properties of nanoparticles accounting for the boundary scattering and for the carrier fluid velocity indicate that the plasma oscillations in Si, GaN, and InGaAs and nanoparticles may achieve high quality factors. Other materials including, but not limited to, diamond, graphene or graphene heterostructures with van der Waals materials may be used for heterodimensional devices, consistent with the present disclosure. Advantageously, these oscillations are not impeded by contact resistances. This enables resonant response to the THz radiation inducing polarization dependent resonant dipole moment in some embodiments. An array of such particles placed into perforated asymmetrical 2 DEG or/and 2 DHG structures or superlattices may be used for detection, mixing, or frequency multiplication of sub-THz, THz or IR radiation in some embodiments. These structures may be used as elements of sub-THz or THz emitting devices enabling a better impedance matching for extracting the electromagnetic radiation in other embodiments. The embedded nanoparticle arrays capacitively coupled to 2 DEG or 2 DHG systems could be also used as sub-THz, THz, or IR sensitive photodetector layer for pixelless THz to visible converters.

Other embodiments of the technology include tunable THz and infrared field effect and field effect array detectors, mixers, phase shifters, delay lines, frequency multipliers operating in resonant and/or non-resonant regimes using nanostructures, e.g., nanoscale conducting dots, with floating potential capacitively coupled to the transistor gate. The response of such devices may be tunable by the gate bias in some embodiments and may be resonant even when the transistor operates in the collision dominated regime. According to some embodiments, the devices may be capable of detecting frequency and/or amplitude modulated signals. The ultimate modulation frequency could also reach the THz range and may increase performance of selected THz and sub-THz devices and components.

It is understood, that for purposes of this description Al means Aluminum, Ga means Gallium, N means Nitrogen, In means Indium, Si means Silicon, O means Oxygen, C means Carbon, As means Arsenic, Li means Lithium, Nb means Niobium, Ge means Germanium, Sb means Antimony, and P means Phosphorus. Further, it is understood that "group III elements" include the elements Al, Ga, In, Boron (B), and Thallium (Ti), and "group IV elements" include the elements C, Si, Ge, Tin (Sn), and Lead (Pb). Still further, it is understood that "THz radiation" includes radiation having a frequency between approximately 0.1 and 100 terahertz (THz, b $10^{12}$ hertz), and "microwave radiation" includes radiation having a frequency between approximately 1 and 100 gigahertz (GHz, $10^9$ hertz). It is further understood that "infrared radiation" includes radiation having a frequency between approximately 300 GHz and 430 THz.

Embodiments of the technology include semiconducting devices operating in the microwave and/or THz ranges and/or infrared range for the generation, adjustment, and/or detection by adjusting a voltage applied to the semiconducting device. In some embodiments, the semiconducting device has an active layer that includes a two-dimensional (electron or hole) gas. As such, active layers may include any compound capable of including the two-dimensional carrier gas, including, for example, Si, SiGe, Ge, AlGaAs, GaAs, AlN, GaN, InN, AlInAs, InSb, InP, etc. Barrier layers may include, for example, $SiO_2$, SiN, a binary, ternary, or quaternary compound that includes one, two, or three group III elements, respectively, and N or a group IV element, a compound that includes elements of groups II and VI, or a combination of layers of different compositions.

Generally, embodiments of the technology include heterodimensional systems that include semiconducting devices configured to at least one of detect, produce or manipulate electromagnetic radiation. A semiconducting device may include a heterodimensional plasmonic structure and an active layer. The heterodimensional plasmonic structure contains one or more nanostructures configured to form a heterodimensional junction with the active layer. A plurality of nanostructures included in the heterodimensional plasmonic structure may be arranged in a two dimensional array or a three-dimensional array. As used herein, a heterodimensional plasmonic structure is a 2D or 3D array of nanostructures. The active layer may include, but is not limited to, a 2D gas (electron or hole), and/or a 3D gas (electron or hole). At least a portion of the heterodimensional plasmonic structure may be embedded into and isolated from the active layer. Such nanostructures exhibiting a resonance response at room temperature may be capacitively coupled to the active layer and may thus produce detected signals.

FIG. 1 illustrates an isometric view of a semiconducting device 100 consistent with several embodiments of the present disclosure. In an embodiment, semiconducting device 100 may correspond to THZ field effect transistor. Device 100 may be configured to detect, produce and/or manipulate THz electromagnetic radiation, as described herein. Device 100 includes a heterodimensional plasmonic structure 102, an active layer 104 and a substrate 108. Device 100 further includes a gate layer 110 and side contacts 112, 114. For example, the side contacts may correspond to a source 112 and drain 114 of a field effect transistor. The source 112 and drain 114 are positioned adjacent and on opposing sides of the heterodimensional plasmonic structure 102 and of the gate layer 110. The source 112 and the drain 114 are each separated from the gate layer 110 by a respective gap 113, 115. The gaps may 113, 115 facilitate capture of impinging electromagnetic radiation.

The heterodimensional plasmonic structure 102 includes a plurality of nanostructures, e.g., nanostructure 106, as described herein. The nanostructures may be arranged in an array. In one nonlimiting example, each nanostructure may correspond to a nanocolumn. However, this disclosure is not limited in this regard. The gate layer 110 defines a plurality of voids, e.g., void 111. Each void, e.g., void 111, is configured to align with a corresponding nanostructure, e.g., nanostructure 106, and may be sized to accommodate the nanostructure 106 and a depletion region 107. For example, each nanostructure, e.g., nanostructure 106, may be surrounded by a depletion region, e.g., depletion region 107, separating the nanostructure 106 from the gate layer 110. In one nonlimiting example, the void and/or depletion region may be configured to facilitate capacitive coupling between the nanostructure and the gate.

A shape of the nanostructure 106 and/or the void 107 may be generally circular, generally ellipsoidal with a long axis generally parallel to a side of the gate 110, generally ellipsoidal with the long axis at an angle with respect to the side of the gate, and/or may have a compound shape that includes a plurality of generally circular and/or ellipsoidal shapes. However, this disclosure is not limited in this regard.

It may be appreciated that the nanostructures, e.g., nanostructure 106, may be positioned below the void 111 defined in the gate layer 110. The void 111 may generally align with the depletion region 107.

Device 100 may be configured to detect, produce or manipulate electromagnetic radiation having a frequency in the sub-THz, THz or infrared frequency range. The heterodimensional plasmonic structure 102 and/or the nanostructures are configured to form a heterodimensional junction with the active layer 104 and to have a tunable resonant plasmon frequency. For example, the plasmon frequency may be tuned by application of a bias voltage to the gate 110. The resonant coupling may be achieved at or near room temperature and at sub-THz and THz frequencies. In some embodiments, device 100 may be configured with an asymmetry between the source 112 and drain 114, configured to enhance detections. For example, the gate layer 110 and/or the heterodimensional plasmonic structure 102 may include one or more asymmetric features, as described herein.

Figure 2:
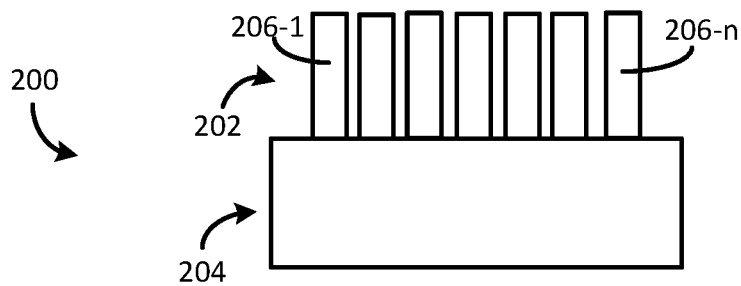
FIG. 2 illustrates a side view of a semiconducting device including a three-dimensional (3D) gas, consistent with some embodiments of the present disclosure.

FIG. 2 illustrates a side view of a semiconducting device 200 including a three-dimensional (3D) gas, consistent with some embodiments of the present disclosure. Device 200 includes a heterodimensional plasmonic structure 202 and an active layer 204. The heterodimensional plasmonic structure 202 includes a plurality of nanostructures 206-1, ..., 206-n. In this embodiment, the active layer 204 corresponds to a three-dimensional (3D) gas. For example, the active layer 204 may correspond to a 3D electron gas (3 DEG). In another example, the active layer 204 corresponds to a 3D hole gas (3 DHG). The nanostructures 206-1, ..., 206-n may include, but are not limited to, nanodots, nanoparticles, nanowires, nanocones, nanotubes, nanocolumns and/or a combination thereof. In one nonlimiting example, the nanostructures 206-1, ..., 206-n may correspond to nanotubes with each nanotube containing a plurality of nanowires, e.g., an array of nanowires.

The nanostructures 206-1, ..., 206-n are configured to form a heterodimensional junction with the active layer 204. The nanostructures 206-1, ..., 206-n may be configured to have a tunable resonant plasmon frequency. The plasmon resonant frequency may be tuned by application of a voltage to device 200. In some embodiments, the heterodimensional plasmonic structure 202 and the plurality of nanostructures 206-1, ..., 206-n may be configured to form a heterodimensional contact with the active layer 204.

Device 200 may be configured to support plasma waves. Device 200 may be configured to detect, produce or manipulate electromagnetic radiation having a frequency in the sub-THz, THz or infrared frequency range. In other words, the electromagnetic radiation may have a frequency of at least 100 gigahertz (GHz).

Figure 3:
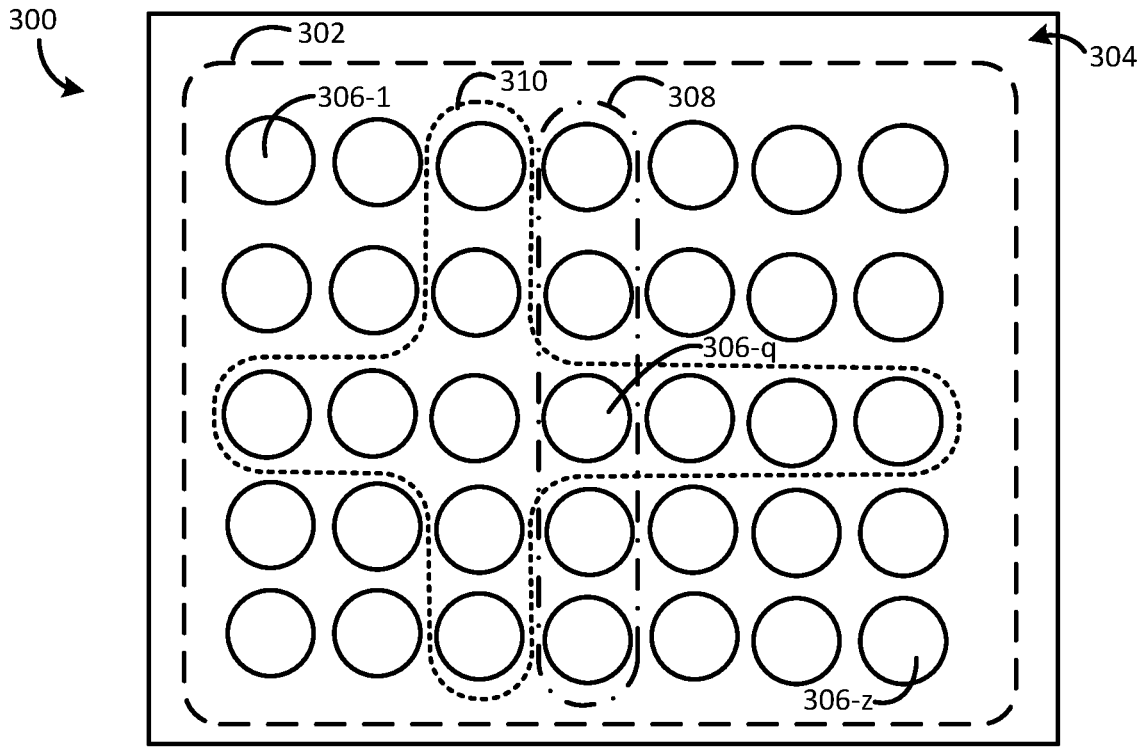
FIG. 3 illustrates a top view of a semiconducting device consistent with several embodiments of the present disclosure.

FIG. 3 illustrates a top view 300 of a semiconducting device consistent with several embodiments of the present disclosure. Device 300 may be configured to detect, produce or manipulate electromagnetic radiation having a frequency in the sub-THz, THz or infrared frequency range, as described herein.

Device 300 includes a heterodimensional plasmonic structure 302 and a base layer 304. The heterodimensional plasmonic structure 302 includes a plurality of nanostructures 306-1, ..., 306-$q$, ..., 306-$z$, as described herein. The nanostructures 306-1, ..., 306-$q$, ..., 306-$z$ may be arranged in an array. In an embodiment, a first portion of the plurality of nanostructures may be fabricated with a first set of parameters and a second portion of the plurality of nanostructures may be fabricated with a second set of parameters where a selected first parameter of the first set differs from a selected second parameter of the second set by at least one percent (%). Parameters may include, but are not limited to, physical dimensions, materials and/or material properties, etc. For example, one nanostructure, e.g., nanostructure 306-$q$, may be fabricated with at least one parameter that differs from the parameters of the other nanostructures by at least one percent. In another example, a portion of nanostructures, e.g., column of nanostructures 308, may be fabricated with at least one parameter that differs from the parameters of the other nanostructures by at least one percent. In another example, nanostructures 306-1, ..., 306-$q$, ..., 306-$z$ may be arranged in a periodic array with a portion 310 of rows and/or columns configured to form a plasmonic waveguide. In an embodiment, the base layer 304 may correspond to an active layer, e.g., a 2D electron gas (2 DEG), a 3 DEG, a 2D hole gas (2 DHG), or a 3 DHG. In another embodiment, the base layer 304 may correspond to a passivation layer.

Figure 4A:
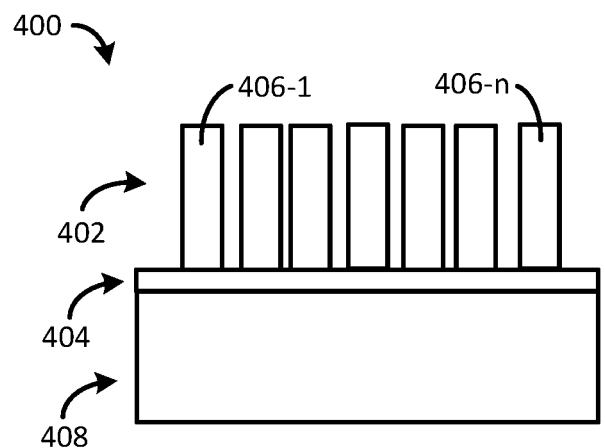
FIG. 4A illustrates a side view of a semiconducting device including an ungated two-dimensional (2D) gas, consistent with some embodiments of the present disclosure.

FIG. 4A illustrates a side view of a semiconducting device 400 including an ungated two-dimensional (2D) gas, consistent with some embodiments of the present disclosure. Device 400 includes a heterodimensional plasmonic structure 402, an active layer 404 and a substrate 408. The active layer 404 is positioned between the heterodimensional plasmonic structure 402 and the substrate 408. The heterodimensional plasmonic structure 402 includes a plurality of nanostructures 406-1, ..., 406-$n$, as described herein. In this embodiment, the active layer 404 corresponds to a 2D gas. For example, the active layer 404 may correspond to a 2DEG. In another example, the active layer 404 corresponds to a 2 DHG.

The nanostructures 406-1, ..., 406-$n$ are configured to form a heterodimensional junction with the active layer 404 (i.e., with the ungated 2D gas). Device 400 may be configured to detect, produce or manipulate electromagnetic radiation having a frequency in the sub-THz, THz or infrared frequency range, as described herein.

Figure 4B:
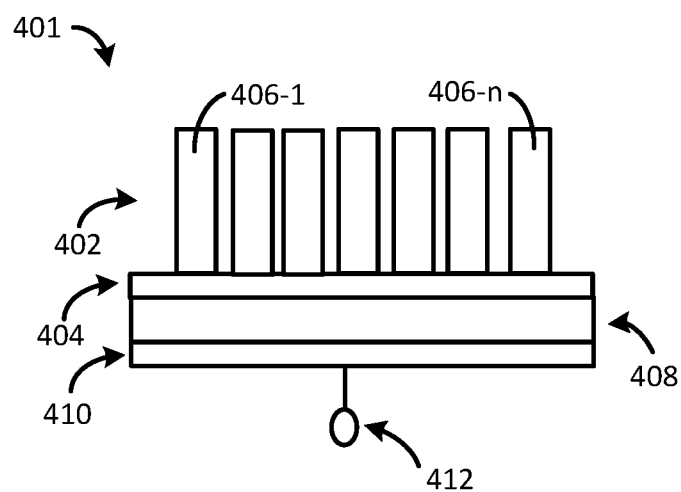
FIG. 4B illustrates a side view of a semiconducting device including a gated 2D gas, consistent with some embodiments of the present disclosure.

FIG. 4B illustrates a side view of a semiconducting device 401 including a gated 2D gas, consistent with some embodiments of the present disclosure. Similar to device 400, device 401 includes the heterodimensional plasmonic structure 402, the active layer 404 and the substrate 408. Device 401 further includes a gate 410 and a gate electrode 412. The active layer 404 is positioned between the heterodimensional plasmonic structure 402 and the substrate 408. The gate 410 is positioned opposite the active layer 404 with the substrate 408 sandwiched therebetween. The heterodimensional plasmonic structure 402 includes a plurality of nanostructures 406-1, ..., 406-$n$, as described herein. In this embodiment, the active layer 404 corresponds to a 2D gas. For example, the active layer 404 may correspond to a 2 DEG. In another example, the active layer 404 corresponds to a 2 DHG.

The nanostructures 406-1, ..., 406-$n$ are configured to form a heterodimensional junction with the active layer 404 (i.e., with the gated 2D gas). In some embodiments, the heterodimensional plasmonic structure 402 and the plurality of nanostructures 406-1, ..., 406-$n$ may be configured to form a heterodimensional contact with the active layer 404. The nanostructures 406-1, ..., 406-$n$ may be configured to have a tunable resonant plasmon frequency. For example, the resonant plasmon frequency may be tuned via a bias voltage applied to the gate 410. Device 400 may be configured to detect, produce or manipulate electromagnetic radiation having a frequency in the sub-THz, THz or infrared frequency range.

Figure 5A:
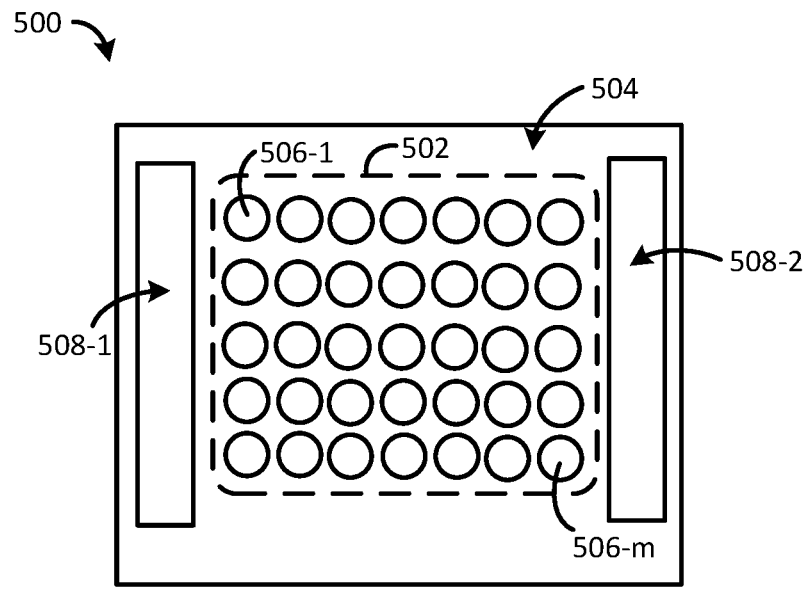
FIGS. 5A and 5B illustrate top views of a semiconducting device with continuous side contacts and continuous side contacts in a cross configuration, respectively, consistent with several embodiments of the present disclosure.
Figure 5B:
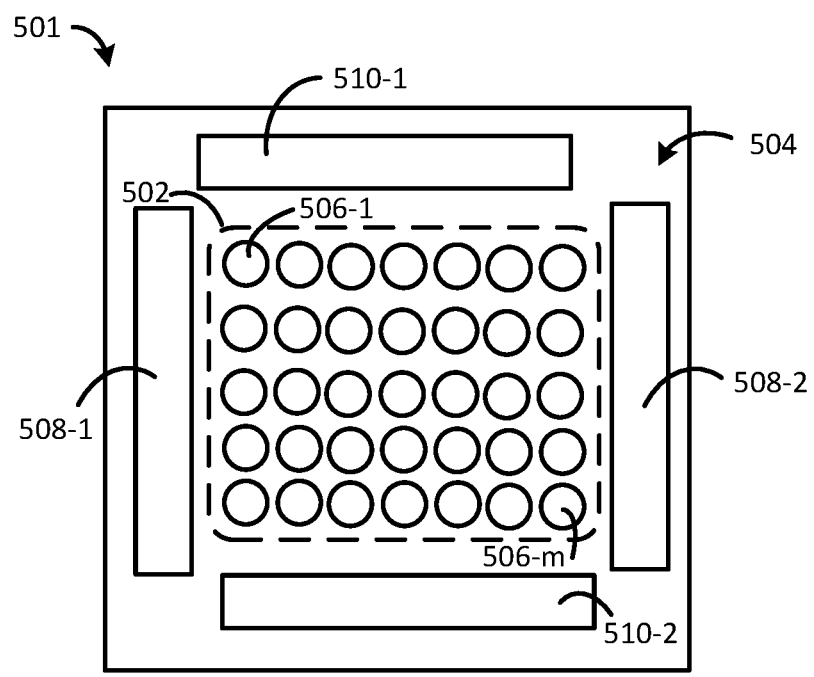

FIGS. 5A and 5B illustrate top views of a semiconducting device with continuous side contacts 500 and continuous side contacts in a cross configuration 501, respectively, consistent with several embodiments of the present disclosure. Devices 500, 501 include a heterodimensional plasmonic structure 502, a base layer 504 and a first pair of side contacts 508-1, 508-2. The heterodimensional plasmonic structure 502 includes a plurality of nanostructures 506-1, ..., 506-$m$, as described herein. The side contacts 508-1 and 508-2 are positioned adjacent and on opposing sides of the array of nanostructures 506-1, ..., 506-$m$ that form the heterodimensional plasmonic structure 502.

Device 501 further includes a second pair of continuous side contacts 510-1, 510-2. The heterodimensional plasmonic structure 502 includes a plurality of nanostructures 506-1, ..., 506-$m$, as described herein. The first pair of continuous side contacts 508-1 and 508-2 are positioned adjacent and on opposing sides (i.e., left side and right side) of the array of nanostructures 506-1, ..., 506-$m$ that form the heterodimensional plasmonic structure 502. The second pair of continuous side contacts 510-1 and 510-2 are positioned adjacent and on opposing sides (i.e., top and bottom) of the array of nanostructures 506-1, ..., 506-$m$.

In an embodiment, the base layer 504 may correspond to an active layer, e.g., a 2 DEG, a 3 DEG, a 2 DHG, or a 3 DHG. In this embodiment, the plurality of nanostructures 506-1, ..., 506-$m$ may be configured to form heterodimensional contact with the active layer 504. In another embodiment, the base layer 504 may correspond to a passivation layer.

Figure 6A:
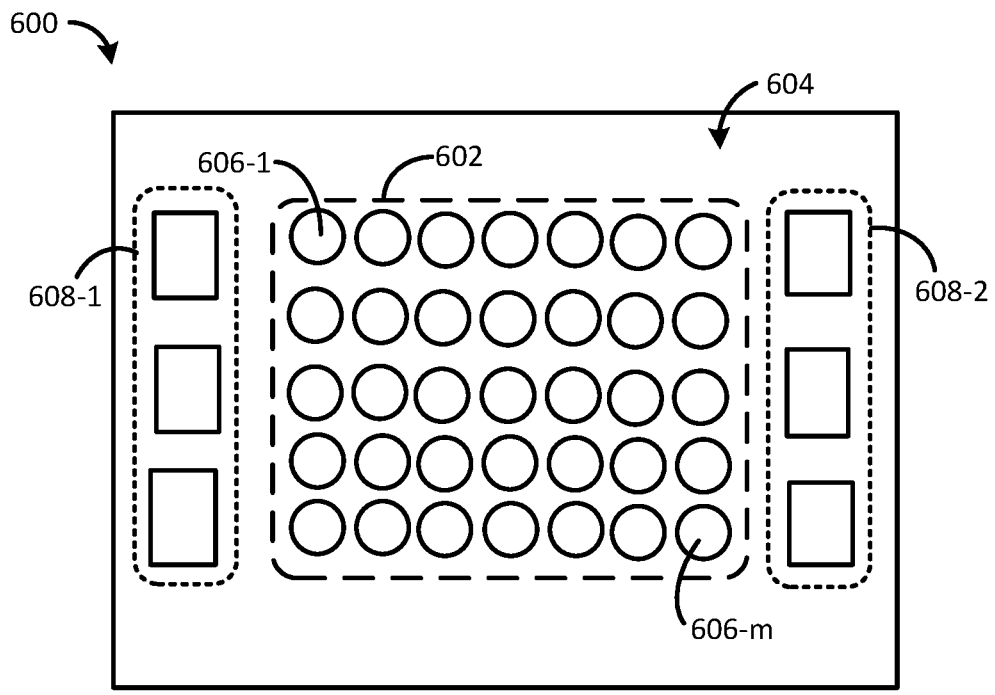
FIGS. 6A and 6B illustrate a top view of a semiconducting device with split side contacts split side contacts in a cross configuration, respectively, consistent with several embodiments of the present disclosure.
Figure 6B:
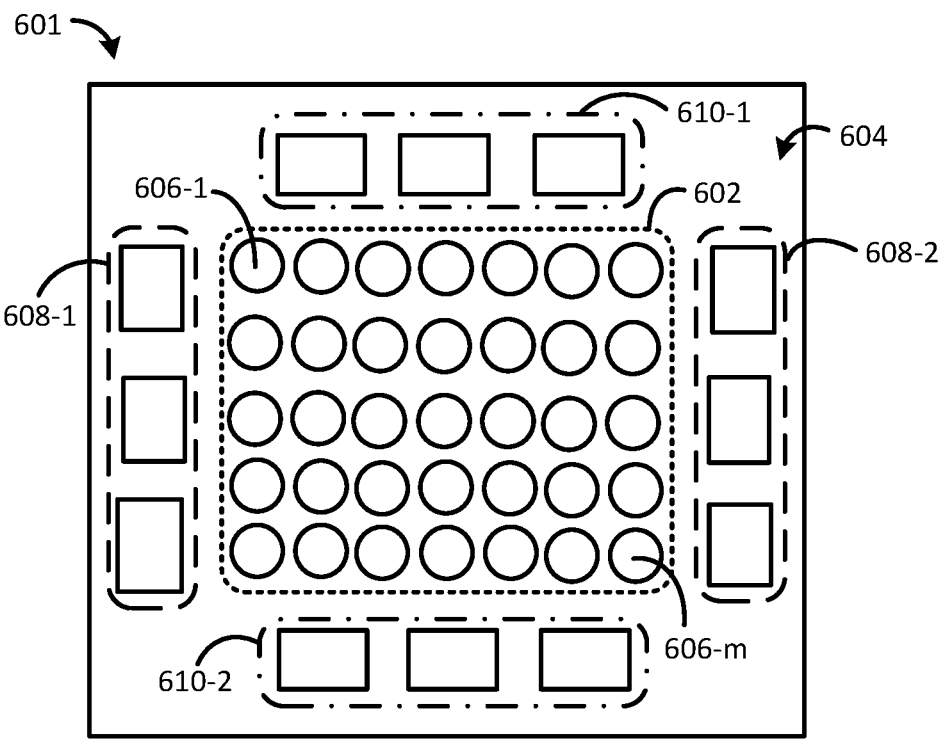

FIGS. 6A and 6B illustrate a top view of a semiconducting device with split side contacts 600 and split side contacts in a cross configuration 601, respectively, consistent with several embodiments of the present disclosure. Devices 600, 601 include a heterodimensional plasmonic structure 602 and a base layer 604. The heterodimensional plasmonic structure 602 includes a plurality of nanostructures 606-1, ..., 606-$m$, as described herein.

Devices 600, 601 include a first pair of sets 608-1, 608-2 of split side contacts. Device 601 further includes a second pair of sets 610-1, 610-2 of split side contacts. Each set 608-1, 608-2, 610-1, 610-2 of split side contacts includes a plurality of contact portions. In one nonlimiting example, the number of contact portions in each plurality of split side contacts may be three. However, this disclosure is not limited in this regard. Other embodiments may include more or fewer contact portions. The first pair of sets 608-1 and 608-2 of split side contacts are positioned adjacent and on opposing sides (i.e., left side and right side) of the array of nanostructures 606-1, ..., 606-$m$ that form the heterodimensional plasmonic structure 602. The second pair of sets 610-1 and 610-2 of split side contacts are positioned adjacent and on opposing sides (i.e., top and bottom) of the array of nanostructures 606-1, ..., 606-$m$.

In an embodiment, the base layer 604 may correspond to an active layer, as described herein. In this embodiment, the plurality of nanostructures 606-1, . . . , 606-m may be configured to form heterodimensional contact with the active layer 604 and the split side contacts may be configured to contact the active layer. In another embodiment, the base layer 604 may correspond to a passivation layer.

It may be appreciated that one or more of the configurations (e.g., plasmonic waveguide) of the array of nanostructures 302 of the semiconducting device of FIG. 3 may be utilized in one or more embodiments of semiconducting devices 500, 501, 600, and/or 601 of FIGS. 5A, 5B, 6A and 6B, respectively.

Figure 7:
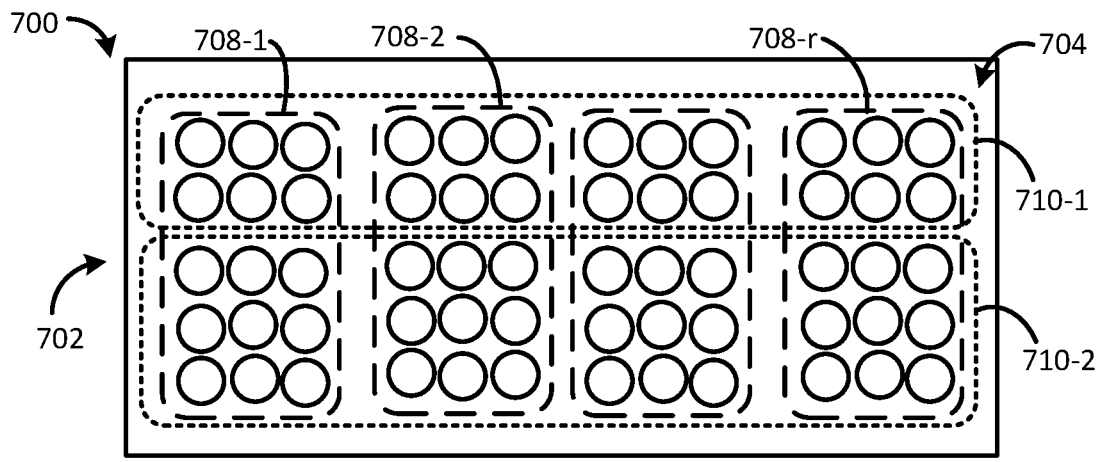
FIG. 7 illustrates a top view of a semiconducting device with a periodic array of nanostructures, periodically modulated, consistent with several embodiments of the present disclosure.

FIG. 7 illustrates a top view 700 of a semiconducting device with a periodic array of nanostructures, periodically modulated, consistent with several embodiments of the present disclosure. Device 700 includes a heterodimensional plasmonic structure 702 and a base layer 704. The heterodimensional plasmonic structure 702 includes a plurality of nanostructures, as described herein. In an embodiment, the heterodimensional plasmonic structure 702 may include a plurality of portions with each portion including a respective array of nanostructures. The plurality of arrays of nanostructures may be periodic and/or may be periodically modulated. For example, the heterodimensional plasmonic structure 702 may include an array of nanostructures arranged in a plurality of periodic portions 708-1, 708-2, . . . , 708-r that are periodically modulated in one direction. In another example, the heterodimensional plasmonic structure 702 may include the array of nanostructures arranged in a first plurality of periodic portions 708-1, 708-2, . . . , 708-r that are periodically modulated in a first direction. Continuing with this example, the array of nanostructures may be further arranged in a second plurality of portions 710-1, 710-2, that are periodically modulated in a second direction. The second direction may differ from the first direction. In an embodiment, the base layer 704 may correspond to an active layer, e.g., a 2D electron gas (2 DEG), a 3 DEG, a 2D hole gas (2 DHG), or a 3 DHG. In this embodiment, the plurality of nanostructures may be configured to form heterodimensional contact with the active layer 704. In another embodiment, the base layer 704 may correspond to a passivation layer.

Figure 8:
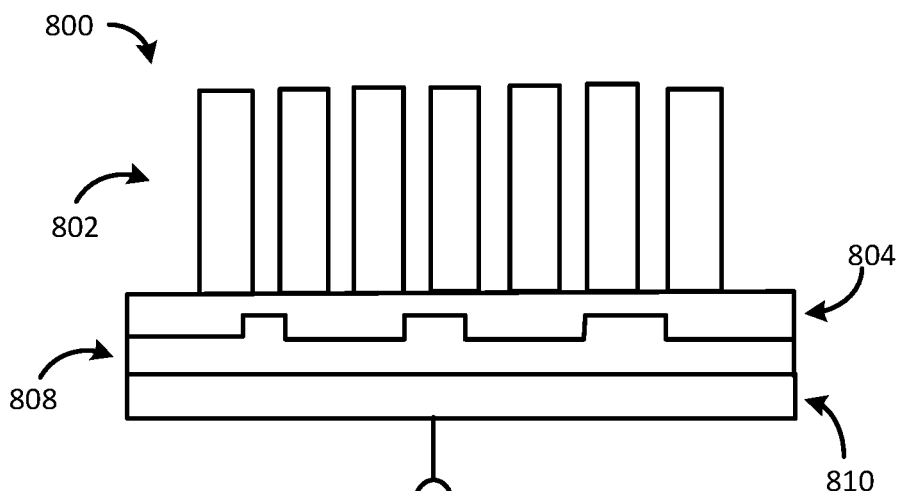
FIG. 8 illustrates a side view of a semiconducting device including a periodically modulated active layer, consistent with some embodiments of the present disclosure.

FIG. 8 illustrates a side view 800 of a semiconducting device including a periodically modulated active layer, consistent with some embodiments of the present disclosure. Device 800 includes a heterodimensional plasmonic structure 802, an active layer 804, a substrate 808 and a gate 810. The active layer 804 is positioned between the heterodimensional plasmonic structure 802 and the substrate 808. The gate 810 is positioned opposite the active layer 804 with the substrate 808 sandwiched therebetween. The heterodimensional plasmonic structure 802 includes a plurality of nanostructures, as described herein. In this embodiment, the active layer 804 corresponds to a periodically modulated 2D gas. For example, the active layer 804 may correspond to a periodically modulated 2 DEG. In another example, the active layer 804 corresponds to a periodically modulated 2 DHG.

The heterodimensional plasmonic structure 802 and corresponding nanostructures are configured to form a heterodimensional junction with the active layer 804 (i.e., with the periodically modulated 2D gas). For example, the heterodimensional plasmonic structure 802 and corresponding nanostructures may be configured to form a heterodimensional contact with the periodically modulated 2D gas. The periodically modulated 2D gas may or may not be gated.

The heterodimensional plasmonic structure 802 and corresponding nanostructures may be configured to have a tunable resonant plasmon frequency. For example, the resonant plasmon frequency may be tuned via a bias voltage applied to the gate 810. Device 800 may be configured to detect, produce or manipulate electromagnetic radiation having a frequency in the sub-THz, THz or infrared frequency range.

Figure 9:
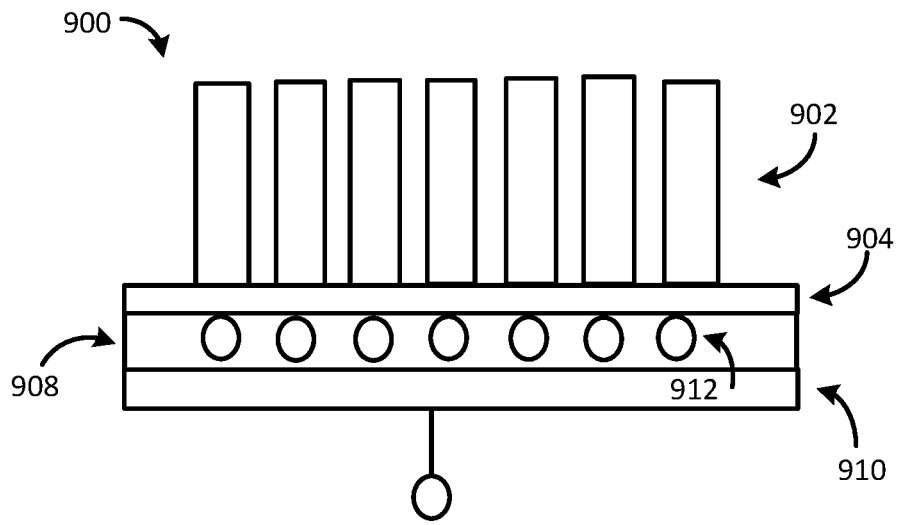
FIG. 9 illustrates a side view of a semiconducting device including a substrate having a microfluidic channel, consistent with some embodiments of the present disclosure.

FIG. 9 illustrates a side view 900 of a semiconducting device including a substrate having a microfluidic channel, consistent with some embodiments of the present disclosure. Device 900 includes a heterodimensional plasmonic structure 902, an active layer 904, a substrate 908 and a gate 910. The active layer 904 is positioned between the heterodimensional plasmonic structure 902 and the substrate 908. The gate 910 is positioned opposite the active layer 904 with the substrate 908 sandwiched therebetween. In an embodiment, the device 900 includes a plurality of microfluidic channels 912. The microfluidic channels may be defined by and/or included in the substrate 908. The heterodimensional plasmonic structure 902 includes a plurality of nanostructures, as described herein. In this embodiment, the active layer 904 corresponds to a 2D gas. For example, the active layer 904 may correspond to a 2 DEG. In another example, the active layer 904 corresponds to a 2 DHG.

The heterodimensional plasmonic structure 902 and corresponding nanostructures are configured to form a heterodimensional junction with the active layer 904 (i.e., with the 2D gas). For example, the heterodimensional plasmonic structure 902 and corresponding nanostructures may be configured to form a heterodimensional contact with the 2D gas having microfluidic channels 912. The heterodimensional plasmonic structure 902 and corresponding nanostructures may be configured to have a tunable resonant plasmon frequency. For example, the resonant plasmon frequency may be tuned via a bias voltage applied to the gate 910. Device 900 may be configured to detect, produce or manipulate electromagnetic radiation having a frequency in the sub-THz, THz or infrared frequency range.

Figure 10A:
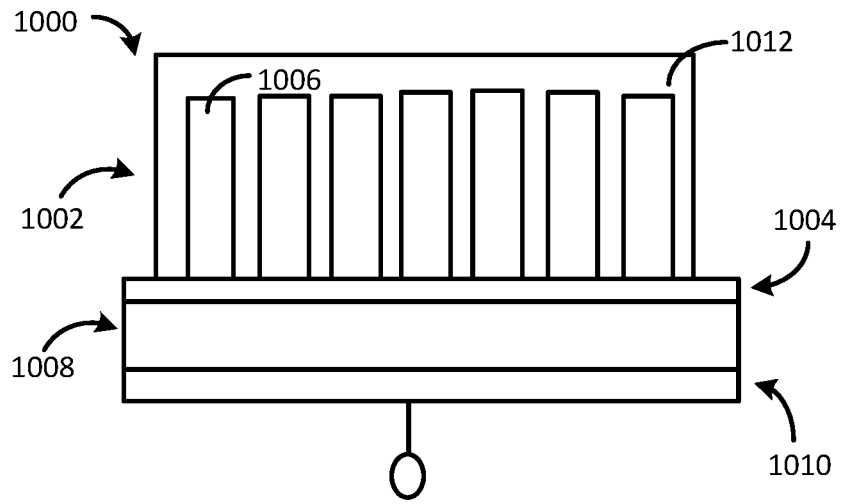
FIGS. 10A through 10C illustrate respective side views of three example semiconducting devices that each include a respective passivating layer, consistent with some embodiments of the present disclosure.
Figure 10B:
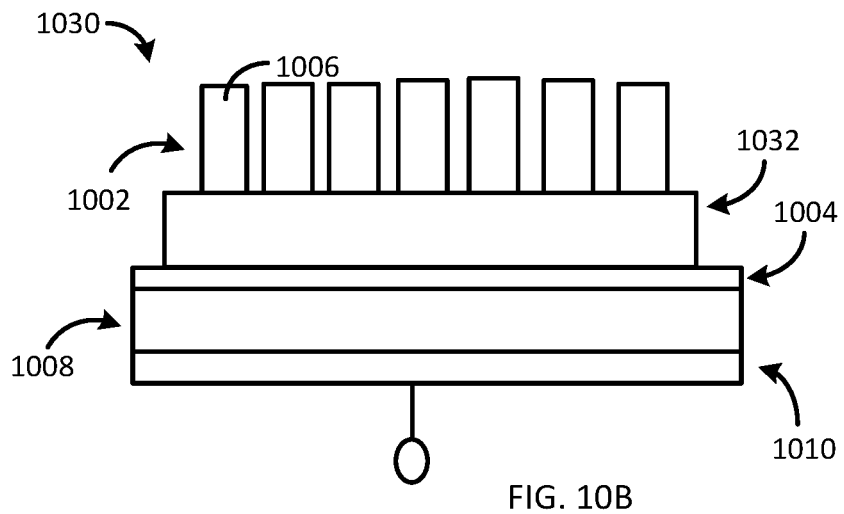
Figure 10C:
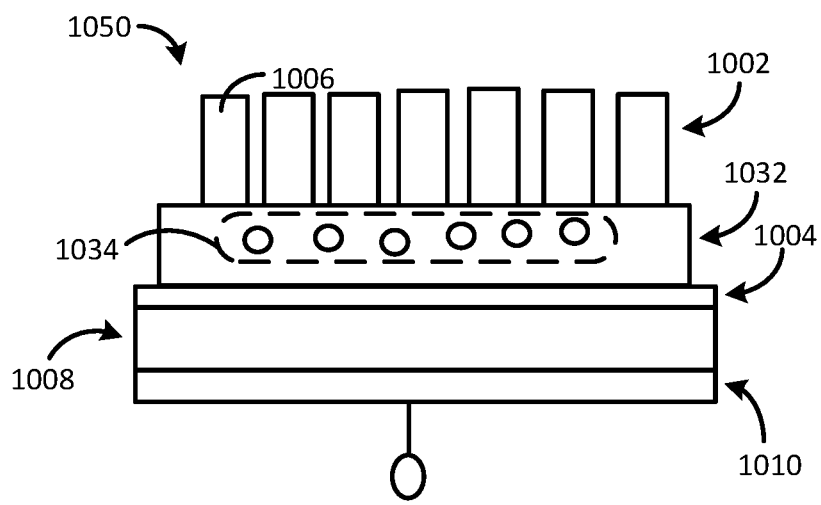

FIGS. 10A through 10C illustrate respective side views 1000, 1030, 1050 of three example semiconducting devices that each include a respective passivating layer, consistent with some embodiments of the present disclosure. FIGS. 10A through 10C may be best understood when considered together. Each device 1000, 1030, 1050 includes a heterodimensional plasmonic structure 1002, an active layer 1004, a substrate 1008 and a gate 1010. The active layer 1004 is positioned between the heterodimensional plasmonic structure 1002 and the substrate 1008. The gate 1010 is positioned opposite the active layer 1004 with the substrate 1008 sandwiched therebetween. The heterodimensional plasmonic structure 1002 includes a plurality of nanostructures, e.g., nanostructure 1006, as described herein. In this embodiment, the active layer 1004 corresponds to a 2D gas, as described herein.

The heterodimensional plasmonic structure 1002 and corresponding nanostructures are configured to form a heterodimensional junction with the active layer 1004 (i.e., with the periodically modulated 2D gas). The heterodimensional plasmonic structure 1002 and corresponding nanostructures may be configured to have a tunable resonant plasmon frequency. For example, the resonant plasmon frequency may be tuned via a bias voltage applied to the gate 1010. Each of devices 1000, 1030, 1050 may be configured to detect, produce or manipulate electromagnetic radiation having a frequency in the sub-THz, THz or infrared frequency range.

Device 1000 of FIG. 10A includes a passiviting layer 1012. In this example, the heterodimensional plasmonic structure 1002 is embedded in the passivating layer 1012 such that the passivating layer 1012 surrounds each nanostructure on their respective tops and sides but not on their respective bottoms where the nanostructures may contact the active layer 1004.

Device 1030 of FIG. 10B includes a passiviting layer 1032. In this example, the heterodimensional plasmonic structure 1002 is embedded in the passivating layer 1032 such that each nanostructure extends above the passivating layer 1032 on the top. The passivating layer 1032 then contacts the active layer 1004 at or near the bottom of the passivating layer 1032.

Device 1050 of FIG. 10C includes the passiviting layer 1032, as described herein, and further includes a plurality of microfluidic channels 1034. The microfluidic channels are embedded in and/or defined by the passivating layer 1032. In this example, the heterodimensional plasmonic structure 1002 is embedded in the passivating layer 1032 such that each nanostructure extends above the passivating layer 1032 on the top. The passivating layer 1032 then contacts the active layer 1004 at or near the bottom of the passivating layer 1032.

Figure 11A:
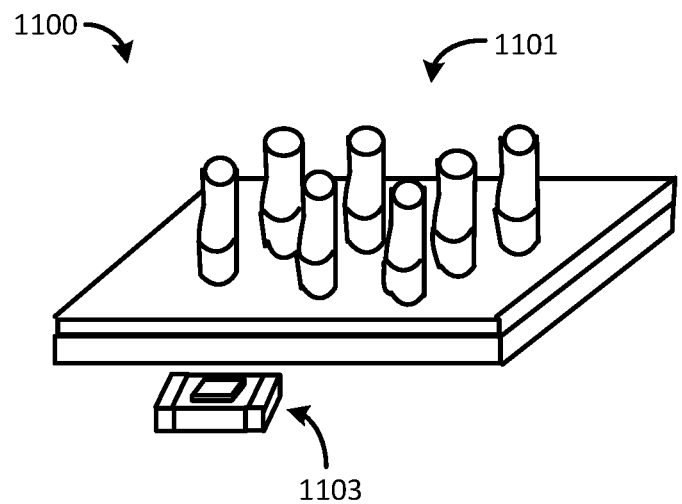
FIGS. 11A and 11B illustrate two example systems including a semiconducting device and one or a plurality of scanning detectors, respectively, consistent with some embodiments of the present disclosure.
Figure 11B:
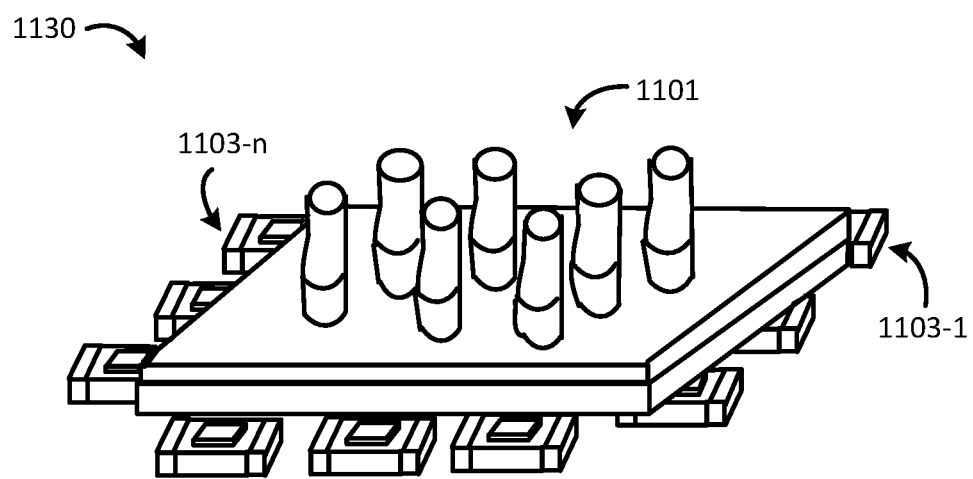

FIGS. 11A and 11B illustrate two example systems 1100, 1130 including a device under test (DUT) and one scanning detector or a plurality of detectors, respectively, consistent with some embodiments of the present disclosure. Example systems 1100, 1130 each includes a DUT 1101. Example system 1100 further includes one scanning detector 1103. Example system 1130 further includes a plurality of detectors 1103-1, . . . , 1103-n. The scanning detector 1103 and each of the plurality of detectors 1103-1, . . . , 1103-n are examples of a semiconducting device consistent with several embodiments of the present disclosure. The scanning detector 1103 and each of the plurality of detectors 1103-1, . . . , 1103-n may thus each include a heterodimensional plasmonic structure that includes one or more nanostructures and may further include an active layer, as described herein.

In an embodiment, the DUT 1101 may be an integrated circuit that is to be imaged by scanning detector 1103 or the plurality of detectors 1103-1, . . . , 1103-n. For example, the scanning detector 1103 may be moved to each of a plurality of positions in order to scan a portion or all the DUT 1101. In another example, each detector of the array of detectors 1103-1, . . . , 1103-n may be configured to remain stationary and to capture a respective image of a portion of the DUT 1101.

Figure 12A:
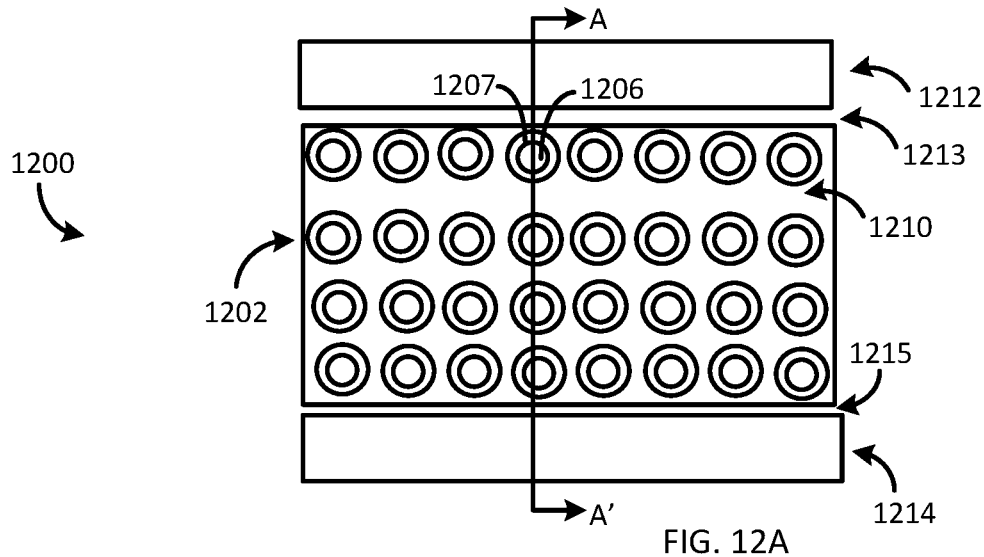
FIGS. 12A and 12B illustrate a top view of a semiconducting device and a side view cross-section (A-A') of the semiconducting device, respectively, consistent with some embodiments of the present disclosure.
Figure 12B:
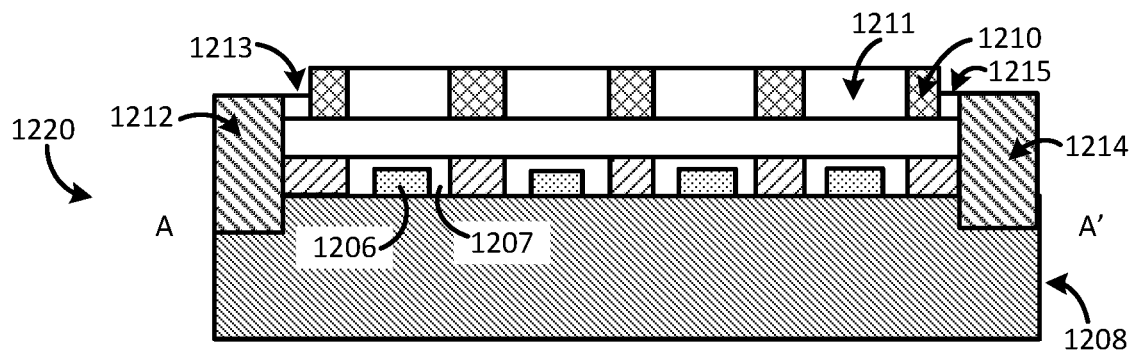

FIGS. 12A and 12B illustrate a top view of a semiconducting device 1200 and a side view cross-section (A-A') 1220 of the semiconducting device, respectively, consistent with some embodiments of the present disclosure. FIGS. 12A and 12B may be best understood when considered together. Device 1200 includes a heterodimensional plasmonic structure 1202, a gate layer 1210 and side contacts 1212, 1214. For example, the side contacts may correspond to a source 1212 and drain 1214 of a field effect transistor. The source 1212 and drain 1214 are positioned adjacent and on opposing sides of the heterodimensional plasmonic structure 1202 and of the gate layer 1210. The source 1212 and the drain 1214 are each separated from the gate layer 1210 by a respective gap 1213, 1215. Thus, device 1200 may correspond to a side contact configuration, as described herein. In another embodiment, device 1200 may be configured with side contacts in a cross configuration, as described herein. It may be appreciated that the gaps 1213, 1215 may facilitate receipt and capture of impinging electromagnetic radiation by the semiconducting device. In an embodiment, the gate material may transparent thus further facilitating capture of impinging electromagnetic radiation of a THz beam.

The heterodimensional plasmonic structure 1202 includes a plurality of nanostructures, e.g., nanostructure 1206, arranged in an array, as described herein. In one nonlimiting example, each nanostructure may correspond to a nanodot. However, this disclosure is not limited in this regard. Each nanostructure 1206 is surrounded by a depletion region 1207, separating the nanostructure 1206 from the gate layer 1210. A shape of the nanostructure 1206 and/or the void 1207 may be generally circular, generally ellipsoidal with a long axis generally parallel to a side of the gate 1210, generally ellipsoidal with the long axis at an angle with respect to the side of the gate, and/or may have a compound shape that includes a plurality of generally circular and/or ellipsoidal shapes. However, this disclosure is not limited in this regard.

It may be appreciated that the nanostructures, e.g., nanostructure 1206, may be positioned below a void 1211 defined in the gate layer 1210. The void 1211 may generally align with the depletion region 1207.

Device 1200 may be configured to detect, produce or manipulate electromagnetic radiation having a frequency in the sub-THz, THz or infrared frequency range.

Figure 13:
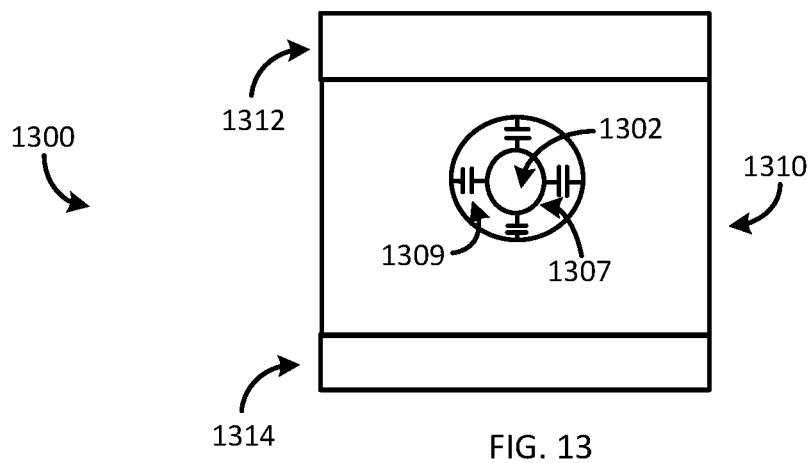
FIG. 13 illustrates is a top view of a semiconducting device that includes a nanostructure capacitively coupled to a gate, consistent with some embodiments of the present disclosure.

FIG. 13 illustrates is a top view of a semiconducting device 1300 that includes a nanostructure 1302 capacitively coupled to a gate 1310, consistent with some embodiments of the present disclosure. In one nonlimiting example, the nanostructure 1302 may correspond to a nanodot.

The gate 1310 may define a void 1307 configured to accommodate the nanostructure 1302. Device 1300 further includes side contacts 1312 and 1314. For example, the side contacts 1312, 1314 may correspond to a source and drain, respectively, of a field effect transistor. The capacitive coupling is illustrated by a plurality of capacitances, e.g., capacitance 1309.

A shape of the nanodot 1302 and/or the void 1307 may be generally circular, generally ellipsoidal with a long axis generally parallel to a side of the gate 1310, generally ellipsoidal with the long axis at an angle with respect to the side of the gate, and/or may have a compound shape that includes a plurality of generally circular and/or ellipsoidal shapes. However, this disclosure is not limited in this regard.

Figure 14:
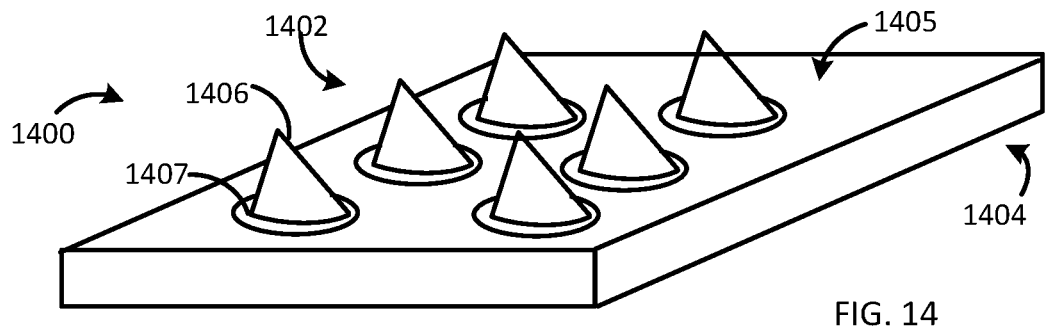
FIG. 14 illustrates an isometric view of a semiconducting device that includes embedded generally conical nanostructures.

FIG. 14 illustrates an isometric view 1400 of a semiconducting device that includes embedded generally conical nanostructures. Device 1400 includes a heterodimensional plasmonic structure 1402 and an active layer 1404. The heterodimensional plasmonic structure 1402 includes a plurality of nanostructures, e.g., nanostructure 1406, arranged in an array, as described herein. In one nonlimiting example, each nanostructure may correspond to a nanocone, i.e., may have a generally conical shape. However, this disclosure is not limited in this regard. Each nanostructure 1406 may be embedded in the active layer 1404 resulting in a void 1407 surrounding the nanocone 1406 at a top surface 1405 of the active layer 1404. A shape of the void 1407 may generally correspond to a shape of a cross section of the nanocone. However, this disclosure is not limited in this regard. The active layer 1404 may include, but is not limited to, a 2D electron gas (2 DEG), a 3 DEG, a 2D hole gas (2 DHG), or a 3 DHG. The active layer may thus correspond to an ungated gas.

Device 1400 may be configured to detect, produce or manipulate electromagnetic radiation having a frequency in the sub-THz, THz or infrared frequency range.

Figure 15:
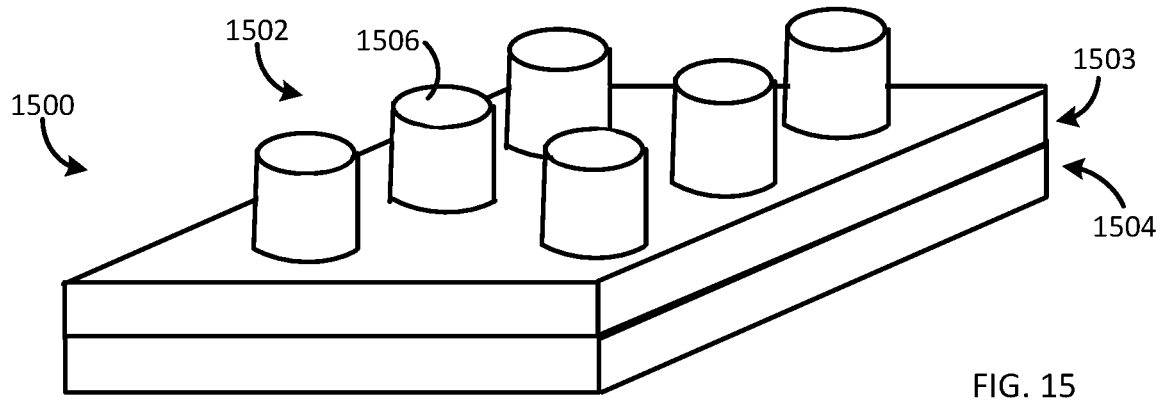
FIG. 15 illustrates an isometric view of a semiconducting device that includes an insulating layer.

FIG. 15 illustrates an isometric view 1500 of a semiconducting device that includes an insulating layer. Device 1500 includes a heterodimensional plasmonic structure 1502, an insulating layer 1503 and an active layer 1504. The insulating layer 1503 is positioned (i.e., sandwiched) between the heterodimensional plasmonic structure 1502 and the active layer 1504.

The heterodimensional plasmonic structure 1502 includes a plurality of nanostructures, e.g., nanostructure 1506, arranged in an array, as described herein. In one nonlimiting example, each nanostructure corresponds to a nanocolumn, i.e., may have a generally cylindrical shape. However, this disclosure is not limited in this regard.

Device 1500 may be configured to detect, produce or manipulate electromagnetic radiation having a frequency in the sub-THz, THz or infrared frequency range.

Figure 16:
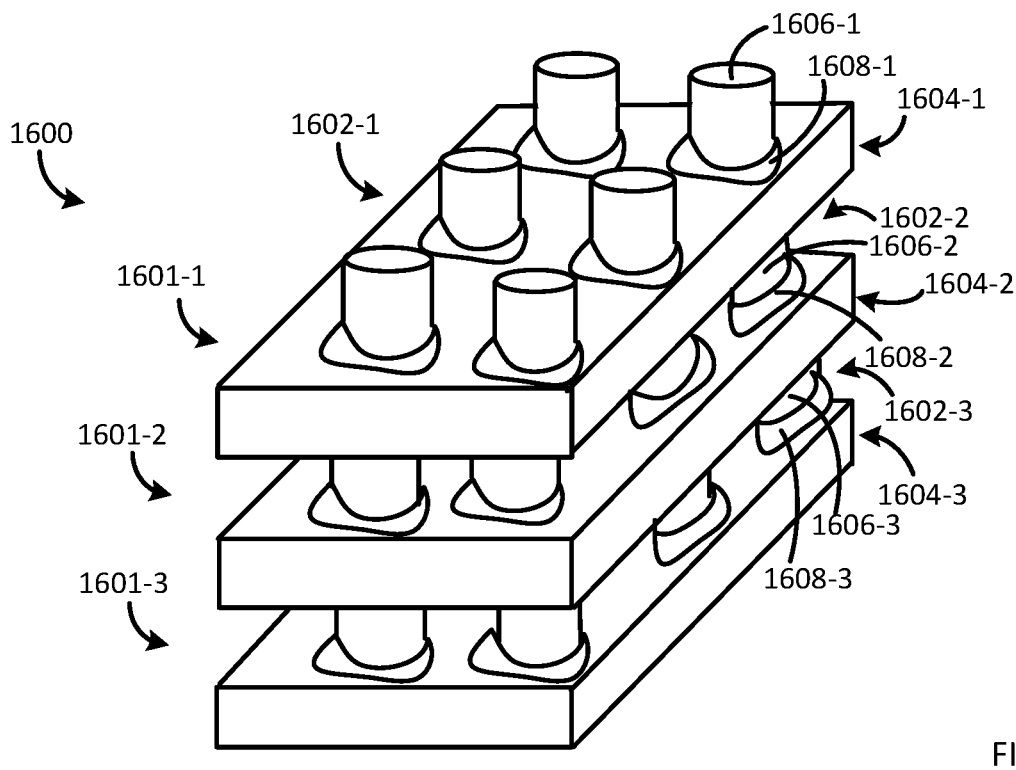
FIG. 16 illustrates an isometric view of a semiconducting device that includes a plurality of stacked lattices.

FIG. 16 illustrates an isometric view 1600 of a semiconducting device that includes a plurality of stacked lattices. Device 1600 includes a top lattice 1601-1, a middle lattice 1601-2 and a bottom lattice 1601-3. Each lattice 1601-1, 1601-2, 1601-3 includes a respective heterodimensional plasmonic structure 1602-1, 1602-2, 1602-3 and a corresponding respective active layer 1604-1, 1604-2, 1604-3. Each respective heterodimensional plasmonic structure 1602-1, 1602-2, 1602-3 includes a plurality of nanostructures, e.g., nanostructure 1606-1, 1606-2, 1606-3, respectively. In one nonlimiting example, each nanostructure corresponds to a nanocolumn, i.e., may have a generally cylindrical shape. However, this disclosure is not limited in this regard. In some embodiments, each nanostructure 1606-1, 1606-2, 1606-3 may be separated from the corresponding active layer 1604-1, 1604-2, 1604-3 by a respective region 1608-1, 1608-2, 1608-3. For example, the region may be a void and/or may be configured to facilitate capacitive coupling. In another example, a nanostructure may extend from above the top lattice 1601-1 through a top active layer 1604-1 and a middle active layer 1604-2 at least into a bottom active layer 1604-3.

In an embodiment, the active layers 1604-1, 1604-2, 1604-3 may correspond to 2D gases. For example, the active layers 1604-1, 1604-2, 1604-3 may all be a 2 DEG or a 2 DHG. In another example, one active layer may differ from at least one of the other two active layers.

In some embodiments, the device 1600 may correspond to a 3D semiconducting structure. In these embodiments, doping of one active layer may differ from the doping of at least one of the other two active layers. For example, the top active layer 1604-1 may include doping corresponding to p-type, the middle active layer 1604-2 may be undoped (i.e., intrinsic) and the bottom active layer 1604-3 may include doping corresponding to n-type. Thus, in this example, the device 1600 may correspond to a 3D p-i-n device. In another example, the top active layer 1604-1 may include doping corresponding to n-type, the middle active layer 1604-2 may include doping corresponding to p-type and the bottom active layer 1604-3 may include doping corresponding to n-type. Thus, in this example, the device 1600 may correspond to a 3D n-p-n device.

Device 1600 may be configured to detect, produce or manipulate electromagnetic radiation having a frequency in the sub-THz, THz or infrared frequency range.

FIGS. 17A through 17D illustrate example semiconducting devices 1700, 1730, 1750, 1770 that include asymmetry between a drain and source configured to enhance detections, consistent with some embodiments of the present disclosure. The structures of semiconducting devices 1700, 1730, 1750, 1770 are configured to provide an asymmetry between gate and drain that may then enable detection of sub-THz and THz electromagnetic radiation.

Each semiconducting device 1700, 1730, 1750, 1770 includes a respective heterodimensional plasmonic structure 1702, 1732, 1752, 1772. Each heterodimensional plasmonic structure 1702, 1732, 1752, 1772 includes a respective plurality of nanostructures, e.g., nanostructure 1706, 1736, 1756, 1776. Each nanostructure may be surrounded by a respective region, e.g., region 1707, 1737, 1757, 1777, that may correspond to a void, in some embodiments. Each semiconducting device 1700, 1730, 1750, 1770 includes a respective gate 1710, 1740, 1760, 1780, respective source 1712, 1742, 1762, 1782 and respective drain 1714, 1744, 1764, 1784. The structures of semiconducting devices 1700, 1730, 1750, 1770 are configured to provide an asymmetry between gate and drain that may then enable detection of sub-THz and THz electromagnetic radiation. In particular, each respective heterodimensional plasmonic structure 1702, 1732, 1752, 1772 and/or each respective gate 1710, 1740, 1760, 1780 may include an asymmetric feature configured to provide the asymmetry.

Figure 17A:
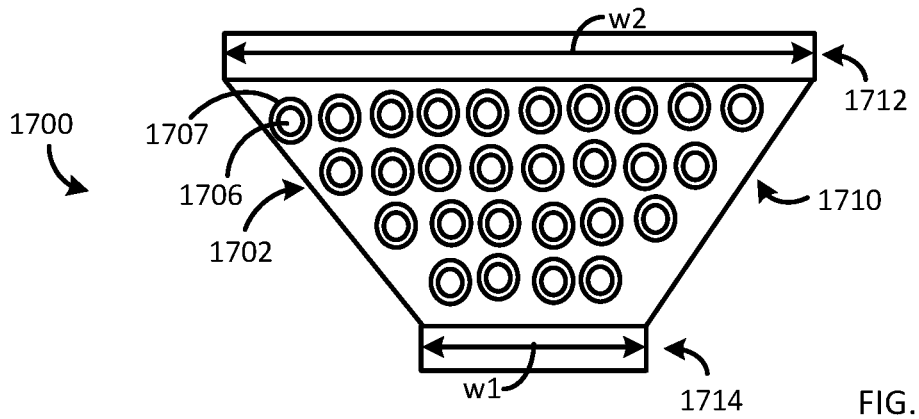
FIGS. 17A through 17D illustrate example semiconducting devices that include asymmetry between a drain and source configured to enhance detections, consistent with some embodiments of the present disclosure.

Turning now to FIG. 17A, FIG. 17A illustrates a top view of example semiconducting device 1700. Semiconducting device 1700 is configured to provide the asymmetry via a variable cross-section of the gate 1710 between the drain 1714 and source 1712. For example, a width, w1, of the drain 1714 is less than a width, w2, of the source 1712. A width of the gate 1710 may thus vary linearly between the drain 1714 and source 1712.

Figure 17B:
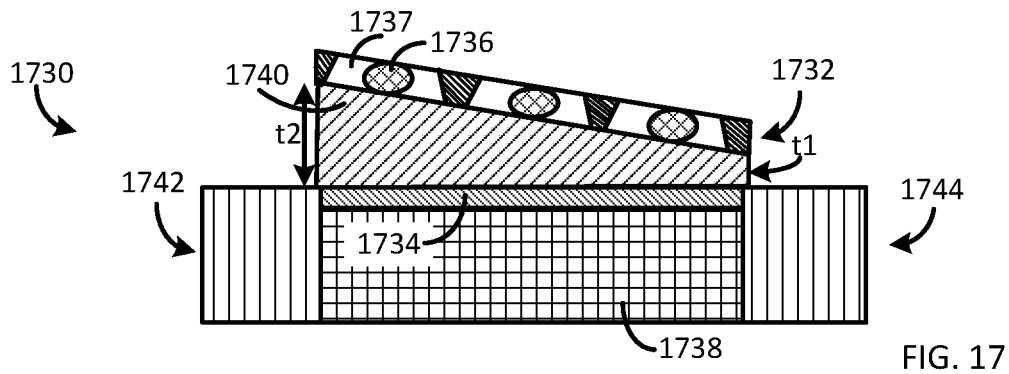

Turning now to FIG. 17B, FIG. 17B illustrates a side view of example semiconducting device 1730. Device 1730 includes an active layer 1734 and a substrate 1738. For example, the active layer 1734 may include a 2D gas, as described herein. The gate 1740 has a variable thickness such that a thickness t1 near the drain 1744 is less than a thickness t2 near the source 1742. In this example, the thickness varies generally linearly between the source 1742 and drain 1744.

Figure 17C:
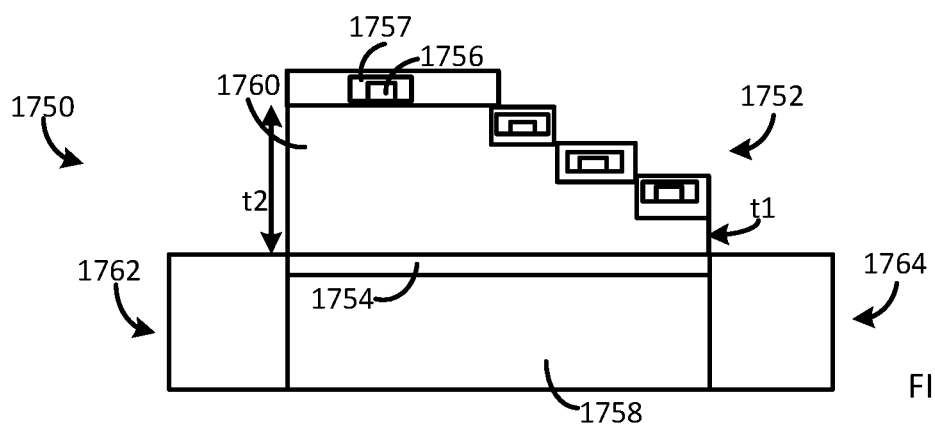

Turning now to FIG. 17C, FIG. 17C illustrates a side view of example semiconducting device 1750. Device 1750 includes an active layer 1754 and a substrate 1758. For example, the active layer 1754 may include a 2D gas, as described herein. The gate 1760 has a variable thickness such that a thickness t1 near the drain 1764 is less than a thickness t2 near the source 1762. The thickness varies generally stepwise between the source 1762 and drain 1764.

Figure 17D:
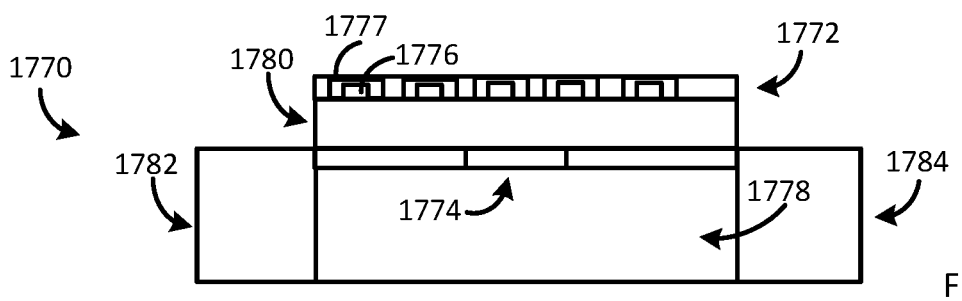

Turning now to FIG. 17D, FIG. 17D illustrates a side view of example semiconducting device 1770. Device 1770 includes an active layer 1774 and a substrate 1778. For example, the active layer 1774 may include a 2D gas, as described herein. The active layer 1774 includes a plurality of regions. The nanostructures of the heterodimensional plasmonic structure 1772 may be nonuniformly distributed between the source 1782 and the drain 1784 with the nonuniformity configured to provide and/or facilitate asymmetry between the gate and the drain, as described herein.

Devices 1700, 1730, 1750, 1770 may be configured to detect, produce or manipulate electromagnetic radiation having a frequency in the sub-THz, THz or infrared frequency range. The structures of semiconducting devices 1700, 1730, 1750, 1770 are configured to provide an asymmetry between gate and drain that may then enable detection of sub-THz and THz electromagnetic radiation. In particular, each respective heterodimensional plasmonic structure 1702, 1732, 1752, 1772 and/or each respective gate 1710, 1740, 1760, 1780 may include an asymmetric feature configured to provide the asymmetry.

Thus, a semiconducting device, consistent with the present disclosure, may be configured to at least one of detect, produce or manipulate electromagnetic radiation. Electromagnetic radiation having a frequency in the microwave and/or THz ranges may be detected by adjusting a voltage applied to the semiconducting device, e.g., a gate bias voltage. The semiconducting device may have an active layer that includes a two-dimensional carrier gas (electron or hole) whose density is controlled by a gate contact. The gate contact may be perforated (i.e., may define one or more voids). Nanostructures positioned in the perforations may be capacitively coupled to the gate. For example, the nanostructures may be coupled to the impinging sub-THz or THz radiation, inducing changes in the gate which change the device threshold voltage and, therefore, may be detected as the drain voltage. In another example, adjusting the gate bias may facilitate modulation of the detected signal. In another example, nonlinearity of the device may facilitate frequency mixing, combining impinging beams of electromagnetic radiation at different frequencies. At a relatively high intensity of the impinging THz beam, frequency multiplication may be achieved. Thus, embodiments of a semiconducting device consistent with the present disclosure may include tunable THz and infrared field effect and field effect array detectors, mixers, phase shifters, delay lines, and frequency multipliers. At least some embodiments may be capable of detecting frequency and/or amplitude modulated signals. At least some embodiments may have room temperature and elevated temperature detectivity, responsivity, and noise equivalent power. Embodiments are configured to be relatively low cost with all-electronic THz system capability. Some embodiments are configured to capture the entire THz beam. In some embodiments, the modulation frequency may reach the THz range. Semiconducting devices consistent with the present disclosure may thus correspond to THz and sub-THz components of THz sensing systems, THz and sub-THz communication systems, beyond 5G Wi-Fi technology, biotechnology and medical THz, IR, and sub-THz systems.

Some embodiments of the semiconducting device include, sub-THz and THz devices and systems for modulation, detection, and generation of sub-THz and THz radiation and for sensing gases, fluids, nanoparticles, mixtures, and biological fluids. Some embodiments may improve performance by capturing the entire electromagnetic beam, eliminating or decreasing contact and parasitic effects, and enabling cost-effective and accurate selective sensing. In some embodiments, common resonances of a nanostructure, e.g., a nanotube, and 2D or 3D electron gas plasma waves may be used, enabling modulation and sensing via heterodimensional junctions. At least some embodiments are compatible with VLSI technology and associated manufacturing process thus enabling cost reduction of THz components and systems.

Various embodiments may include heterodimensional plasmonic structures with nanostructures including, but not limited to, nanoparticles, nanodots, and nanowires of different shapes capacitively coupled to 2 DEG and 2 DHG layers or superlattices. These structures form parts of tunable THz and infrared field effect and field effect array detectors, mixers, phase shifters, delay lines, frequency multipliers operating in resonant and/or non-resonant regimes according to various embodiments of the technology. The response of such devices according to some embodiments is tunable by the gate bias and may be resonant even when the transistor operates in the collision dominated regime but the nanostructures response is resonant. Some embodiments of devices according to the present disclosure are capable of detecting frequency and/or amplitude modulated signal. In some embodiments, the modulation frequency may be in the THz range.

In some embodiments, the THz field may polarize the nanostructures and the response may be sensitive to radiation helicity. Radiation having a frequency in the microwave and/or THz ranges may be detected as the voltage induced between the source and drain contacts. Tuning may be accomplished by adjusting a voltage applied to the semiconducting device. The semiconducting device according to some embodiments, has an active layer or active layers that include 2 DEG or/and 2 DHG, whose density is controlled by the gate contact. The gate contact may be perforated and nanostructures, e.g., nanodots, may be positioned in the perforations and may be capacitively coupled to the gate. The nanodots may be coupled to impinging sub-THz or THz radiation inducing changes in the gate which change the device threshold voltage and, therefore, detected as the drain voltage. Changing the gate bias allows for the modulation of the detected signal.

In some embodiments, asymmetry between the drain and gate is configured to enable detection of impinging electromagnetic radiation. Such asymmetry may be achieved using the boundary conditions in some embodiments (ideally an open circuit between at the drain and short circuit at the source). However, a more efficient detection may be achieved in some embodiments when asymmetry is achieved by a bias drain current or built-in into some embodiments of the device structure.

In some embodiments, THz radiation may be shone onto a gate-drain spacing on the device, or simultaneously shone onto both gate-source spacing and gate drain spacing. Further, in some embodiments, the gate may include a material that allows radiation to pass through it (i.e., be transparent) and the device may include a substrate contact.

Some embodiments use two-dimensional electron or hole gas (or both) that are excited by impinging radiation. In some embodiments, characteristics of the two-dimensional carrier gas may be modified by adjusting the applied voltage, which in turn adjusts the frequency response of the device. In some embodiments, the frequency response of the device may further be adjusted by modifying various physical parameters of the semiconducting device.

When an array of devices (i.e., diodes, field effect transistors, etc.) is used, the same voltage may be applied to the various contacts or two or more different voltages may be applied to the various contacts. While devices are shown having a number and configuring gate, and the configuration of contacts, it is understood that these are presented for illustrative purposes only. Some embodiments of the technology include devices that include any number and/or configuration of contacts.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A semiconducting device for at least one of detecting, producing or manipulating electromagnetic radiation having a frequency of at least 100 gigahertz (GHz), the semiconducting device comprising:
   a heterodimensional plasmonic structure; and
   a periodically modulated active layer selected from the group consisting of a two-dimensional electron gas, a three-dimensional electron gas, a two-dimensional hole gas and a three-dimensional hole gas,
   the heterodimensional plasmonic structure comprising at least one nanostructure configured to form a heterodimensional junction with the active layer and having a tunable resonant plasmon frequency and fabricated with a material selected from the group comprising silicon (Si), gallium-nitride (GaN), indium gallium arsenide (InGaAs), and graphene.

2. The semiconducting device of claim 1, wherein the nanostructure is selected from the group comprising a nanodot, a nanoparticle, a nanocolumn, a nanocone, a nanowire, a nanotube, or a combination thereof.

3. The semiconducting device of claim 1, wherein the active layer is fabricated with a material selected from the group comprising silicon (Si), gallium-nitride (GaN), indium gallium arsenide (InGaAs), and graphene.

4. The semiconducting device according to claim 1, further comprising a gate coupled to the active layer, the gate configured receive a bias voltage, the bias voltage configured to tune the resonant plasmon frequency.

5. The semiconducting device of claim 4, further comprising a drain contact and a source contact contacting the active layer, a configuration of the drain contact and the source contact selected from the group comprising continuous side contacts, split side contacts, side contacts in an opposing configuration and side contacts in a cross configuration.

6. The semiconducting device of claim 4, wherein at least one of the heterodimensional plasmonic structure and the gate comprise an asymmetric feature configured to provide an asymmetry between the source and the drain.

7. The semiconducting device according to claim 1, wherein the heterodimensional plasmonic structure comprises a plurality of nanostructures, the plurality of nanostructures periodically modulated.

8. A semiconducting device for at least one of detecting, producing or manipulating electromagnetic radiation having a frequency of at least 100 gigahertz (GHz), the semiconducting device comprising:
   a heterodimensional plasmonic structure; and
   an active layer selected from the group consisting of a two-dimensional electron gas, a three-dimensional electron gas, a two-dimensional hole gas and a three-dimensional hole gas,
      wherein the heterodimensional plasmonic structure comprises at least one nanostructure configured to form a heterodimensional junction with the active layer and having a tunable resonant plasmon frequency and fabricated with a material selected from the group comprising silicon (Si), gallium-nitride (GaN), indium gallium arsenide (InGaAs), and graphene, and
      wherein the heterodimensional plasmonic structure comprises a plurality of nanostructures, a first portion of the plurality of nanostructures fabricated with a first set of parameters and a second portion of the plurality of nanostructures fabricated with a second set of parameters, a selected first parameter of the first set differing from a selected second parameter of the second set by at least one percent (%).

9. A field effect device for at least one of detecting, producing or manipulating electromagnetic radiation having a frequency of at least 100 gigahertz (GHz), the field effect device comprising:
   a heterodimensional plasmonic structure;
   a periodically modulated active layer selected from the group consisting of a two-dimensional electron gas, a three-dimensional electron gas, a two-dimensional hole gas and a three-dimensional hole gas; and
   a gate, a drain, and a source coupled to the active layer,
   the heterodimensional plasmonic structure comprising at least one nanostructure configured to form a heterodimensional junction with the active layer and having a tunable resonant plasmon frequency and fabricated with a material selected from the group comprising silicon (Si), gallium-nitride (GaN), indium gallium arsenide (InGaAs), and graphene.

10. The field effect device of claim 9, wherein the nanostructure is selected from the group comprising a nanodot, a nanoparticle, a nanocolumn, a nanocone, a nanowire, a nanotube, or a combination thereof.

11. The field effect device of claim 9, wherein the active layer is fabricated with a material selected from the group comprising silicon (Si), gallium-nitride (GaN), indium gallium arsenide (InGaAs), and graphene.

12. The field effect device of claim 9, wherein the gate is configured receive a bias voltage, the bias voltage configured to tune the resonant plasmon frequency.

13. The field effect device according to claim 9, further comprising a drain contact contacting the drain and a source contact contacting the source, a configuration of the drain contact and the source contact selected from the group comprising continuous side contacts, split side contacts, side contacts in an opposing configuration and side contacts in a cross configuration.

14. The field effect device according to claim 9, wherein each nanostructure is capacitively coupled to the gate.

15. The field effect device according to claim 9, wherein at least one of the heterodimensional plasmonic structure and the gate comprise an asymmetric feature configured to provide an asymmetry between the source and the drain.

16. The field effect device according to claim 9, wherein the heterodimensional plasmonic structure comprises a plurality of nanostructures, a first portion of the plurality of nanostructures fabricated with a first set of parameters and a second portion of the plurality of nanostructures fabricated with a second set of parameters, a selected first parameter of the first set differing from a selected second parameter of the second set by at least one percent (%).

* * * * *